United States Patent
Chou et al.

(10) Patent No.: US 10,794,938 B2
(45) Date of Patent: Oct. 6, 2020

(54) VOLTAGE DETECTING CIRCUIT

(71) Applicant: DELTA ELECTRONICS, INC., Taoyuan (TW)

(72) Inventors: Yi-Kai Chou, Taoyuan (TW); Yi-Jan Chang, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 171 days.

(21) Appl. No.: 16/056,503

(22) Filed: Aug. 6, 2018

(65) Prior Publication Data

US 2019/0250194 A1   Aug. 15, 2019

(30) Foreign Application Priority Data

Feb. 14, 2018 (CN) .......................... 2018 1 0151114

(51) Int. Cl.
| | |
|---|---|
| *G01R 17/06* | (2006.01) |
| *H02M 1/36* | (2007.01) |
| *G01R 19/00* | (2006.01) |
| *G01R 15/04* | (2006.01) |
| *H02M 7/06* | (2006.01) |
| *H02M 1/32* | (2007.01) |
| *H02M 5/458* | (2006.01) |

(52) U.S. Cl.
CPC ............ *G01R 17/06* (2013.01); *G01R 15/04* (2013.01); *G01R 19/0038* (2013.01); *H02M 1/32* (2013.01); *H02M 1/36* (2013.01); *H02M 7/06* (2013.01); *H02M 5/458* (2013.01)

(58) Field of Classification Search
USPC ................... 324/99 R, 548, 551, 765.01, 98
See application file for complete search history.

(56) References Cited

U.S. PATENT DOCUMENTS

| | | | | |
|---|---|---|---|---|
| 4,078,393 A | * | 3/1978 | Wills ................... | H02M 1/084 318/806 |
| 4,363,065 A | * | 12/1982 | Hasegawa ................ | H02H 3/26 340/664 |
| 2012/0194202 A1 | * | 8/2012 | Xiao .................... | H02H 7/1203 324/548 |
| 2012/0235666 A1 | * | 9/2012 | Yanagisawa ........... | G01R 15/16 324/98 |
| 2019/0036448 A1 | * | 1/2019 | Terui ................... | H02M 1/4225 |

FOREIGN PATENT DOCUMENTS

| | | |
|---|---|---|
| CN | 103472317 A | 12/2013 |
| CN | 203772967 U | 8/2014 |
| TW | 201030507 A1 | 8/2010 |

* cited by examiner

*Primary Examiner* — Vincent Q Nguyen
(74) *Attorney, Agent, or Firm* — CKC & Partners Co., LLC (57) ABSTRACT

A voltage detecting circuit includes a rectifying circuit, a voltage dividing circuit, and a comparing circuit. The rectifying circuit is configured to rectify a plurality of AC phase voltages to output a plurality of rectified voltages respectively. The voltage dividing circuit is configured to divide the plurality of rectified voltages respectively to output a plurality of sampling voltages. The comparing circuit is configured to compare the plurality of sampling voltages with a reference voltage respectively to provide a plurality of corresponding phase failure detecting voltages. On the condition that the AC phase voltages are unbalanced, the phase failure detecting voltage switches between a high level and a low level.

18 Claims, 6 Drawing Sheets

VOLTAGE DETECTING CIRCUIT

RELATED APPLICATIONS

This application claims priority to China Application Serial Number 201810151114.4, filed Feb. 14, 2018, which is herein incorporated by reference.

BACKGROUND

Technical Field

The present disclosure relates to a voltage detecting circuit, and particularly to a three-phase or multi-phase voltage detecting circuit.

Description of Related Art

Three-phase inverters are often used in various three-phase power systems, for working with the three-phase load and three-phase power sources. However, when a phase failure occurs in any phase of the three-phase power source so as to cause a three-phase unbalanced failure, internal parts are easily damaged due to the circuit malfunctions if the three-phase inverter continues operating. Therefore, in the three-phase system, it is required to monitor and detect abnormal conditions of the three-phase power sources, such as a phase failure or an unbalanced failure, and to break off when the failure occurs to protect the apparatus or system.

SUMMARY

One aspect of the present disclosure is a voltage detecting circuit. The voltage detecting circuit includes a rectifying circuit, a voltage dividing circuit, and a comparing circuit. The rectifying circuit is configured to rectify a plurality of AC phase voltages to output a plurality of rectified voltages respectively. The voltage dividing circuit is configured to divide the rectified voltages respectively to output a plurality of sampling voltages. The comparing circuit is configured to compare the sampling voltages with a reference voltage respectively to provide a phase failure detecting voltage. On the condition that the AC phase voltages are unbalanced, the phase failure detecting voltage switches between a high level and a low level.

Another aspect of the present disclosure is a voltage detecting circuit. The voltage detecting circuit includes a first rectifying circuit, a second rectifying circuit, a voltage dividing circuit, and a comparing circuit. The first rectifying circuit is configured to rectify and superimpose a first phase voltage and a second phase voltage to output a first rectified voltage. The second rectifying circuit is configured to rectify and superimpose the second phase voltage and a third phase voltage to output a second rectified voltage. The voltage dividing circuit is configured to divide the first rectified voltage and the second rectified voltage respectively to output a first sampling voltage and a second sampling voltage accordingly. The comparing circuit is configured to compare the first sampling voltage and the second sampling voltage with a reference voltage respectively to provide a first phase failure detecting voltage and a second phase failure detecting voltage accordingly. The waveforms of the first phase failure detecting voltage and the second phase failure detecting voltage vary in response to whether a power is supplied via of the first phase voltage, the second phase voltage, or the third phase voltage.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiments, with reference made to the accompanying drawings as follows.

DETAILED DESCRIPTION

Reference will now be made in detail to embodiments of the present disclosure, examples of which are described herein and illustrated in the accompanying drawings. While the disclosure will be described in conjunction with embodiments, it will be understood that they are not intended to limit the disclosure to these embodiments. On the contrary, the disclosure is intended to cover alternatives, modifications and equivalents, which may be included within the spirit and scope of the disclosure as defined by the appended claims. It is noted that, in accordance with the standard practice in the industry, the drawings are only used for understanding and are not drawn to scale. Hence, the drawings are not meant to limit the actual embodiments of the present disclosure. In fact, the dimensions of the various features may be arbitrarily increased or reduced for clarity of discussion. Wherever possible, the same reference numbers are used in the drawings and the description to refer to the same or like parts for better understanding.

The terms used in this specification and claims, unless otherwise stated, generally have their ordinary meanings in the art, within the context of the disclosure, and in the specific context where each term is used. Certain terms that are used to describe the disclosure are discussed below, or elsewhere in the specification, to provide additional guidance to the practitioner skilled in the art regarding the description of the disclosure.

In the following description and in the claims, the terms "include" and "comprise" are used in an open-ended fashion, and thus should be interpreted to mean "include, but not limited to." As used herein, the term "and/or" includes any and all combinations of one or more of the associated listed items.

In this document, the term "coupled" may also be termed "electrically coupled," and the term "connected" may be termed "electrically connected." "Coupled" and "connected" may also be used to indicate that two or more elements cooperate or interact with each other. It will be understood that, although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments.

Figure 1:
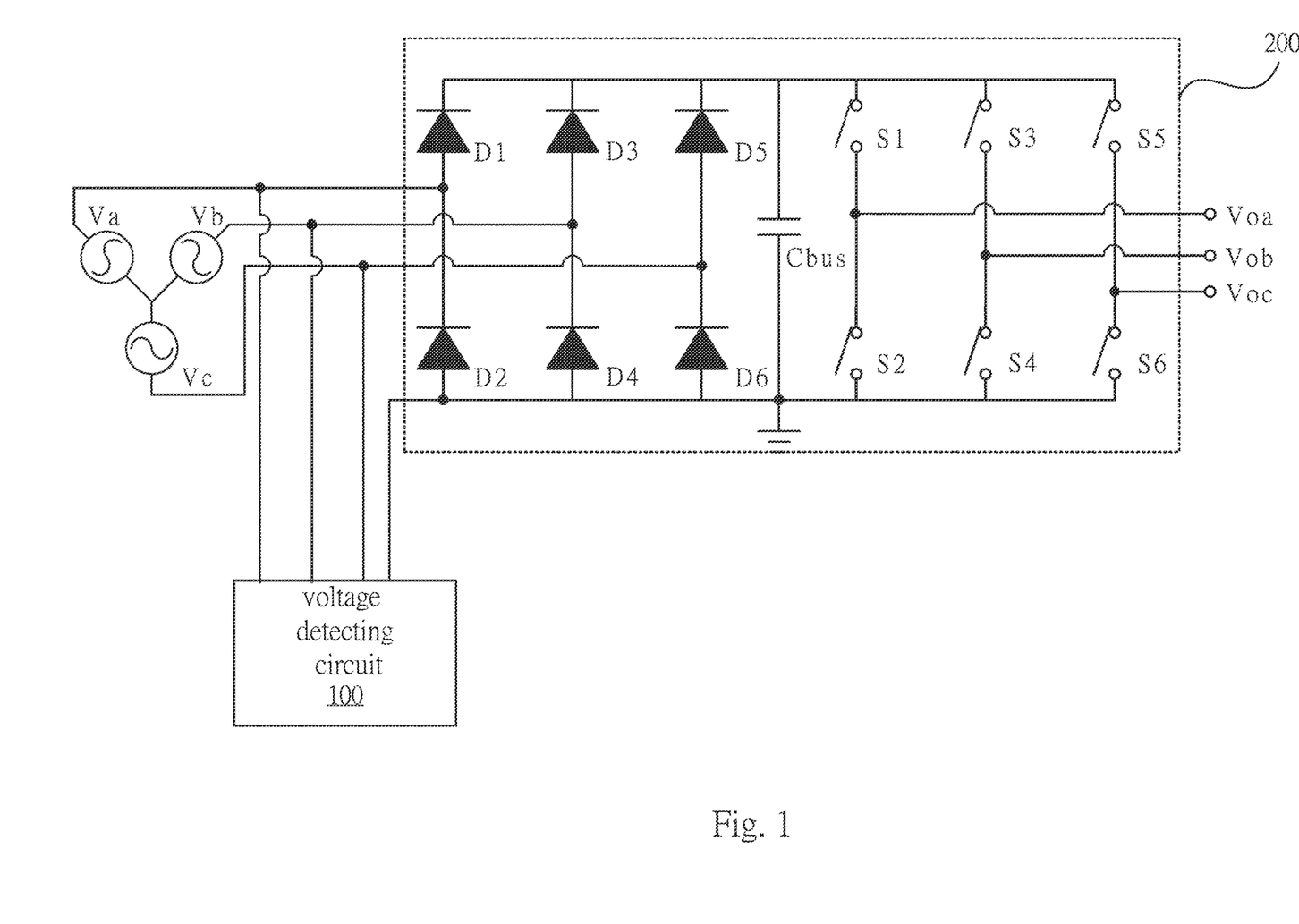
FIG. 1 is a schematic diagram of a voltage detecting circuit with an inverter circuit depicted according to some embodiments of the present disclosure.

Reference is made to FIG. 1. FIG. 1 is a schematic diagram of a voltage detecting circuit 100 with an inverter circuit 200 depicted according to some embodiments of the present disclosure. As shown in FIG. 1, in some embodiments, the voltage detecting circuit 100 may be operated with the inverter circuit 200. The inverter circuit 200 is configured to perform frequency conversion of the three-phase AC power provided by a three-phase input power source. For example, the inverter circuit 200 may rectify AC phase voltages Va, Vb, Vc through the rectifier elements D1-D6 in the corresponding bridge arms to DC signals on the capacitor Cbus respectively, and then convert the DC signals to output voltages Voa, Vob, Voc of AC signals by switching the on or off of the switching elements S1-S6 in the bridge arms at the DC-AC side. Thus, the inverter circuit 200 may adjust the frequencies of the output voltages Voa, Vob, and Voc.

When three-phase unbalanced or even abnormality, such as phase failure, etc., occurs in any phase of the AC phase voltages Va, Vb, Vc inputting the inverter circuit 200, if the inverter circuit 200 retains the original operation, the rectification elements, the capacitors Cbus, or other internal components in the inverter circuit 200 may be damaged. Therefore, during operating the system, the voltage detecting circuit 100 may be electrically coupled to the input side of the inverter circuit 200, and configured to detect whether the AC phase voltages Va, Vb, Vc are unbalanced. In the condition of the input abnormality (e.g., the phase failure or unbalanced), the voltage detecting circuit 100 may initiate a protection mechanism, so that the inverter circuit 200 may break off. In other embodiments, the voltage detecting circuit 100 may also be applied to other three-phase or multi-phase power systems to protect electronic devices that receive three-phase or multi-phase power.

Figure 2:
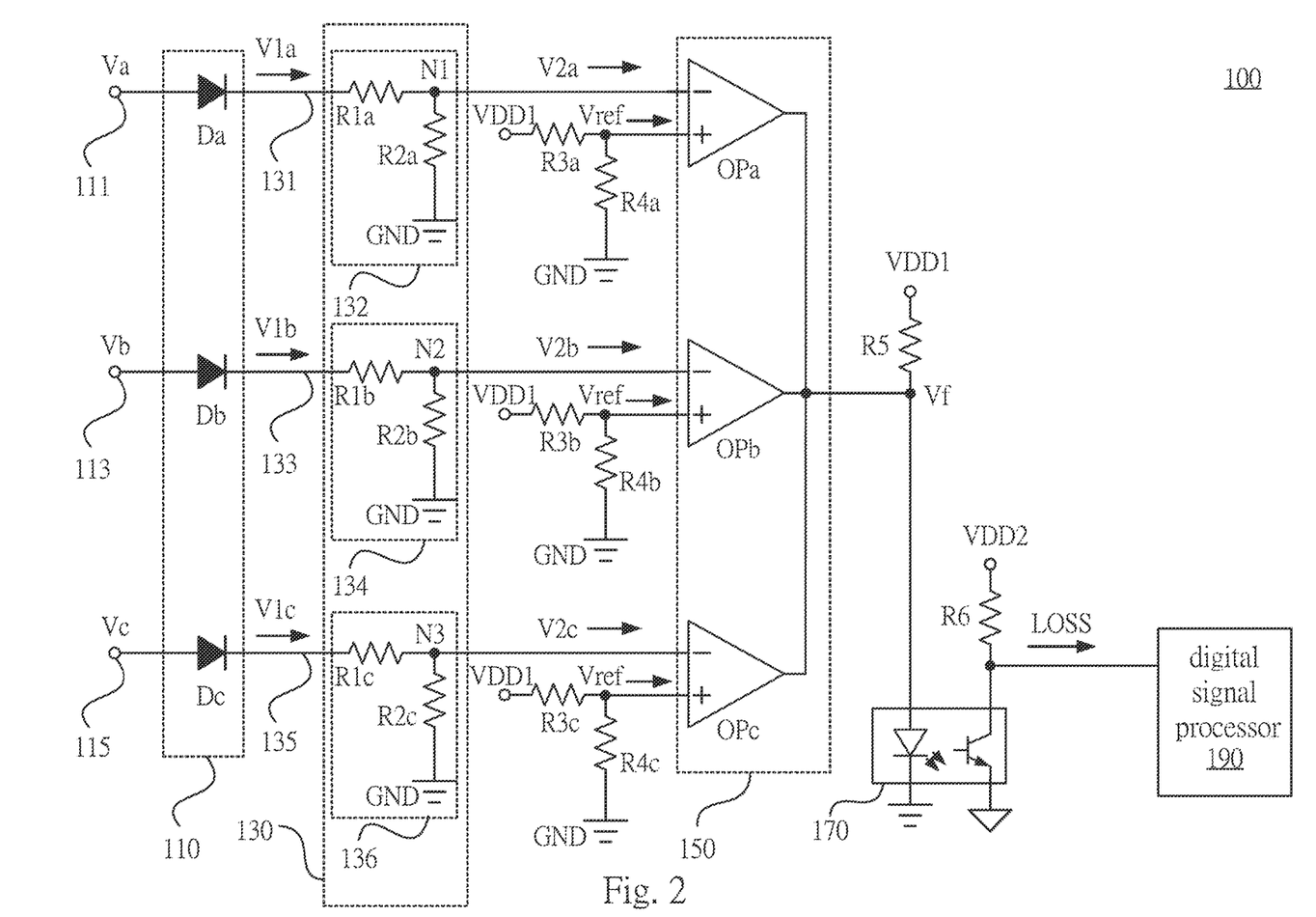
FIG. 2 is a schematic diagram of the voltage detecting circuit depicted according to some embodiments of the present disclosure.

For ease of illustration, reference is made to FIG. 2. FIG. 2 is a schematic diagram of the voltage detecting circuit 100 depicted according to some embodiments of the present disclosure. As shown in FIG. 2, in some embodiments, the voltage detecting circuit 100 includes a rectifying circuit 110, a voltage dividing circuit 130, a comparing circuit 150, an isolating circuit 170, and a digital signal processor 190.

Structurally, inputs 111, 113, and 115 of the rectifying circuit 110 are electrically coupled to the three-phase lines on the input side of the inverter circuit 200 respectively, to receive the AC phase voltages Va, Vb, and Vc, respectively. As a result, the rectifying circuit 110 may rectify the corresponding AC phase voltages Va, Vb, Vc to output rectified voltages V1a, V1b, V1c.

Specifically, as shown in FIG. 1, in some embodiments, the rectifying circuit 110 may include diode units Da, Db, Dc. Structurally, anode ends of the diode units Da, Db, Dc are coupled to the corresponding inputs 111, 113, 115, respectively. The diode unit Da is configured to half-wave rectify the phase voltage Va of the AC phase voltages Va-Vc to output the corresponding rectified voltage V1a in the rectified voltages V1a-V1c.

Similarly, the diode units Db, Dc are configured to half-wave rectify the phase voltages Vb, Vc of the AC phase voltages Va-Vc respectively to output the corresponding rectified voltages V1b, Vic in the rectified voltages V1a, V1c. It should be noted that although the diode units Da, Db, Dc are used for the half-wave rectification in the figures for example, the present application is not limited thereto. One ordinary skill in the art may also rectify the AC phase voltages Va, Vb, Vc by other devices to implement the rectifying circuit 110.

Structurally, inputs 131, 133, 135 of the voltage dividing circuit 130 are electrically coupled to the output sides of the rectifying circuit 110 respectively to receive the corresponding output rectified voltages V1a, V1b, V1c of the rectifying circuits 110. In detail, the voltage dividing circuit 130 is configured to divide the rectified voltages V1a, V1b, V1c respectively to output sampling voltages V2a, V2b, V2c.

Specifically, in some embodiments, since the AC phase voltages Va, Vb, Vc have a relative higher voltage level (e.g., 480 VAC), the voltage dividing circuit 130 may divide the rectified voltages V1a, V1b, V1c to obtain the sampling voltages V2a, V2b, V2c with relative lower voltage levels for comparison and detection for the subsequent circuits.

For example, as shown in FIG. 2, the voltage dividing circuit 130 includes voltage dividing units 132, 134, 136. Any one of the voltage dividing units 132, 134, 136 includes resistors R1a, R1b, R1c and resistors R2a, R2b, R2c connected with one another in series respectively.

Structurally, a first end of the resistor R1a is electrically coupled to a cathode end of the diode unit Da. A first end of the resistor R2a is electrically coupled to a second end of the resistor R1a, and a second end of the resistor R2a is electrically coupled to a ground end GND, i.e., it is grounded.

Similarly, first ends of the resistors R1b, R1c are electrically coupled to cathode ends of the corresponding diode units Db, Dc, respectively. First ends of the resistors R2b, R2c are electrically coupled to second ends of the corresponding resistors R1b, R1c respectively, and second ends of the resistors R2b, R2c are electrically coupled to the ground end GND. As a result, voltage sampling rate may be adjusted (e.g., approximately 1/200 times) by adjusting resistance values between the resistors R1a, R1b, R1c and the resistors R2a, R2b, R2c. In some embodiments, the resistors R1a, R1b, R1c have the same resistance value, and the resistors R2a, R2b, R2c have the same resistance value. In other embodiments, the ratio of the resistor R1a to the resistor R2a is approximately equal to both the ratio of the resistor R1b to the resistor R2b and the ratio of the resistor R1c to the resistor R2c.

As a result, the sampling voltages V2a, V2b, V2c obtained by voltage dividing and sampling through the resistors R1a, R1b, R1c and the resistors R2a, R2b, R2c may be obtained from corresponding nodes N1, N2, and N3 of the voltage dividing circuit 130, respectively.

In some embodiments, the comparing circuit 150 is electrically coupled to the nodes N1, N2, N3 of the voltage dividing circuit 130, and is configured to compare the sampling voltages V2a, V2b, V2c obtained from the nodes N1, N2, N3 with a reference voltage Vref respectively to provide a phase failure detecting voltage Vf. In some embodiments, the reference voltage Vref may be obtained by dividing the supply voltage VDD1 through resistors R3a, R3b, R3c and resistors R4a, R4b, R4c connected with each other in series, but the present disclosure is not limited thereto. In various embodiments, based on the actual requirements, the reference voltage Vref may be a DC signal with a fixed level (e.g., 1V) or a half-wave rectified signal similar to the waveforms of the sampling voltages V2a, V2b, V2c to detect the abnormal states such as phase failure or voltage unbalanced.

As shown in FIG. 2, in some embodiments, the comparing circuit 150 includes comparison amplifiers OPa, OPb, OPc. First inputs (e.g., negative inputs) of the comparison amplifiers OPa, OPb, OPc are electrically coupled to the voltage dividing circuit 130 respectively for receiving the corresponding one of the sampling voltages V2a-V2c. Second inputs (e.g., positive inputs) of the comparison amplifiers OPa, OPb, OPc are configured to receive the reference voltage Vref. The outputs of the comparison amplifiers OPa, OPb, OPc are electrically coupled with each other to output the phase failure detecting voltage Vf.

Specifically, the first input of the comparison amplifier OPa is electrically coupled to the second end of the resistor R1a to receive the sampling voltage V2a of the sampling voltages V2a-V2c.

Similarly, the first inputs of the comparison amplifiers OPb, OPc are electrically coupled to the second ends of the corresponding resistors R1b, R1c respectively, to receive the corresponding sampling voltages V2b, V2c of the sampling voltages V2a-V2c.

Thus, when any one of the sampling voltages V2a-V2c is greater than the reference voltage Vref, the corresponding one of comparison amplifiers OPa, OPb, OPc may pull down the phase failure detecting voltage Vf at the output to a low level.

On condition that the three-phase AC phase voltages Va, Vb, Vc are operated in balance, the amplitudes of phase voltages are approximately the same, and the phase difference is nearly 120 degrees, the comparison amplifiers OPa, OPb, OPc will pull down the phase failure detecting voltage Vf to the low level in turn during a full cycle. On the other hand, when one of the AC phase voltages Va, Vb, Vc is unbalanced (e.g., when the phase failure of the phase voltage Va occurs), the corresponding sampling voltage V2a may be maintained at a low level. As a result, during the period that the sampling voltages V2b, V2c corresponding to the AC phase voltages Vb, Vc are lower than the reference voltage Vref, the comparing circuit 150 may provide the phase failure detecting voltage Vf with a high level (e.g., 1V). In other words, on the condition that the AC phase voltages Va, Vb, Vc are unbalanced, the phase failure detecting voltage Vf is configured to switch between the high level and the low level during a full cycle.

Thus, the voltage detecting circuit 100 may determine the state of the corresponding AC phase voltages Va, Vb, Vc based on whether the phase failure detecting voltage Vf switches between the high level and the low level, and may initiate the protection mechanism in time when the phase failure of one of the AC phase voltages Va, Vb, Vc occurs.

In some embodiments, the voltage detecting circuit 100 may implement the above protection mechanism by the isolating circuit 170 and the digital signal processor 190. As shown in FIG. 2, structurally, the isolating circuit 170 is electrically coupled between the comparing circuit 150 and the digital signal processor 190. In some embodiments, the isolating circuit 170 may be implemented by a photo coupler, but it is not intended to limit the present disclosure.

Specifically, the first side of the isolating circuit 170 is electrically coupled to the outputs of the comparison amplifiers OPa, OPb, OPc to receive the phase failure detecting voltage Vf, and is coupled to a supply voltage VDD1 (e.g., about 15V) of the high-voltage side through a resistor R5. The second side of the isolating circuit 170 is coupled to a supply voltage VDD2 (e.g., about 5V) of the low-voltage side through a resistor R6, and is configured to provide a control signal LOSS corresponding to the phase failure detecting voltage Vf to the digital signal processor 190. The digital signal processor 190 is electrically coupled to the second side of the isolating circuit 170 to receive the control signal LOSS. Thus, the digital signal processor 190 may determine whether the AC phase voltages Va, Vb, Vc are unbalanced based on the control signal LOSS.

It should be noted that the illustration in FIG. 2 is only one possible embodiment of the present disclosure, and is not intended to limit the present disclosure. For example, in other applications without signal isolating, the digital signal processor 190 may receive the phase failure detecting voltage Vf directly to determine whether the AC phase voltages Va, Vb, Vc are unbalanced.

In other words, in various embodiments, regardless of receiving the phase failure detecting voltage Vf directly, or receiving the control signal LOSS corresponding to the phase failure detecting voltage Vf obtained from the conversion by the isolating circuit 170, or other signal processing circuit, the digital signal processor 190 may determine whether the AC phase voltages Va, Vb, Vc are unbalanced based on the voltage level of the phase failure detecting voltage Vf, and may initiate the protection mechanism when the phase failure of one of the AC phase voltages Va, Vb, and Vc occurs.

Figure 3A:
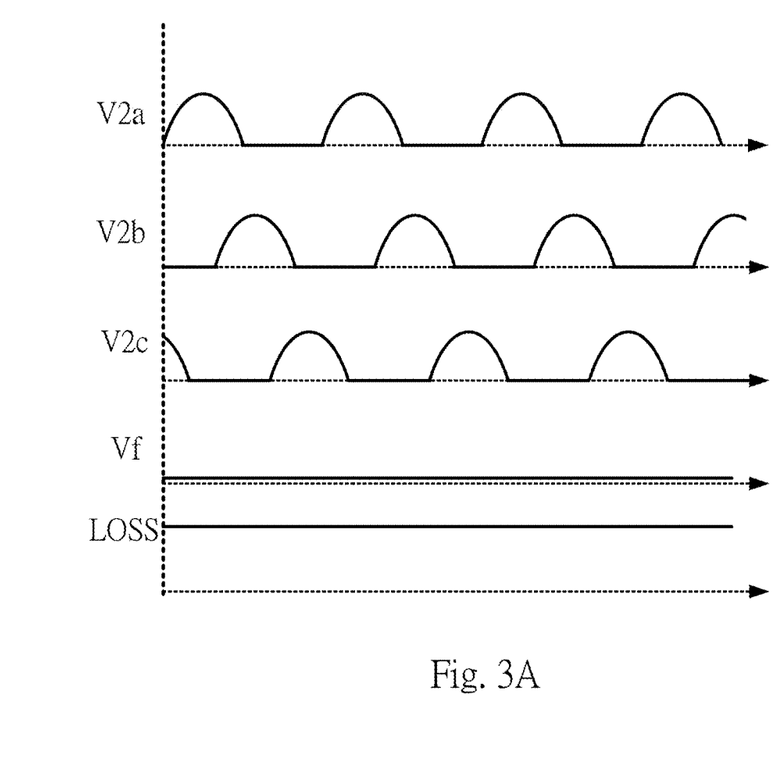
FIGS. 3A and 3B are signal waveform diagrams of the voltage detecting circuit in different input voltage conditions depicted according to some embodiments of the present disclosure.
Figure 3B:
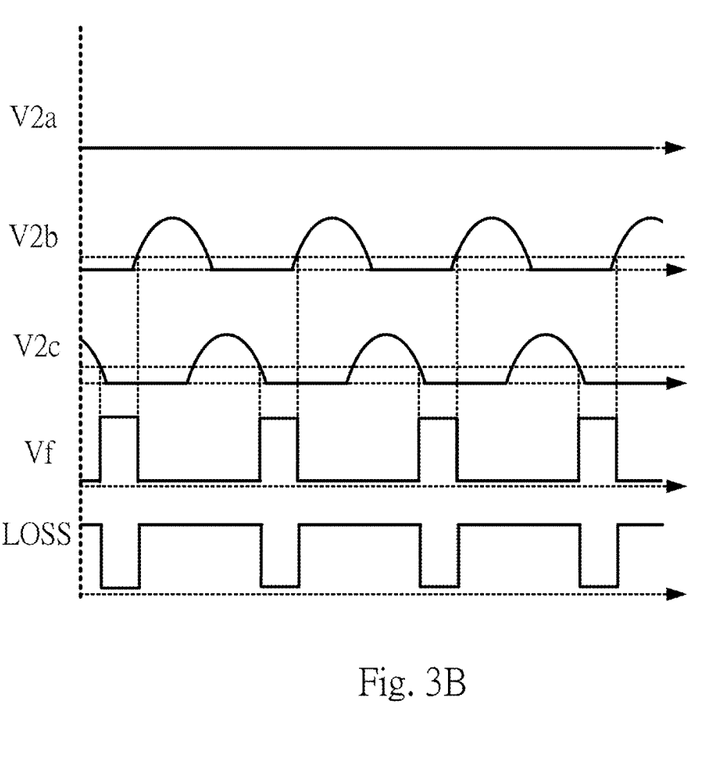

Reference is made to FIGS. 3A and 3B. FIGS. 3A and 3B are signal waveform diagrams of the voltage detecting circuit 100 in different input voltage conditions depicted according to some embodiments of the present disclosure.

As shown in FIG. 3A, when the AC phase voltages Va, Vb, Vc are operated in balance, the amplitudes of phase voltages are the same, and the phase difference of each is 120 degrees, the sampling voltages V2a, V2b, V2c being half-wave rectified, voltage divided, and sampled are half-wave rectified signals with a phase difference of 120 degrees as well. Since at least one of the sampling voltages V2a, V2b, V2c is greater than the reference voltage Vref at any point during the full cycle, the phase failure detecting voltage Vf is always maintained at a low level (e.g., about 0V).

Accordingly, when the phase failure detecting voltage Vf is at the low level, switching elements within the second side of the photo coupler remain off, so that the control signal LOSS is maintained at a high level (e.g., about 5V) corresponding to the supply voltage VDD2 of the low-voltage side.

As shown in FIG. 3B, when the phase failure of the AC phase voltage Va occurs, resulting unbalanced of the three phases, the sampling voltage V2a being half-wave rectified, voltage divided, and sampled is maintained at a low level. The sampling voltages V2b, V2c are still half-wave rectified signals with a phase difference of 120 degrees. When one of the sampling voltages V2b, V2c is greater than the reference voltage Vref, the phase failure detecting voltage Vf is at the low level (e.g., about 0V). In contrast, when the sampling voltages V2b, V2c are less than the reference voltage Vref, the phase failure detecting voltage Vf is at the high level.

Accordingly, when the phase failure detecting voltage Vf is at the high level, the current flows through light-emitting elements within the photo coupler, so that the switching elements within the photo coupler turn on accordingly, to pull down the control signal LOSS to the low level (e.g., about 0V).

Therefore, the digital signal processor 190 may determine whether the AC phase voltages Va, Vb, Vc are balance within the three phases based on the waveform of the control signal LOSS. Although the three-phase power system is taken as an example in the above embodiments, the voltage detecting circuit 100 may also be applied to single phase, two-phase, or other multi-phase power systems, to compare the sampling voltage of each phase and the reference voltage with multiple comparison amplifiers, and couple the outputs of the comparison amplifiers with each other to output the phase failure detecting voltage Vf to determine whether the voltage of the each phase are balance.

Figure 4:
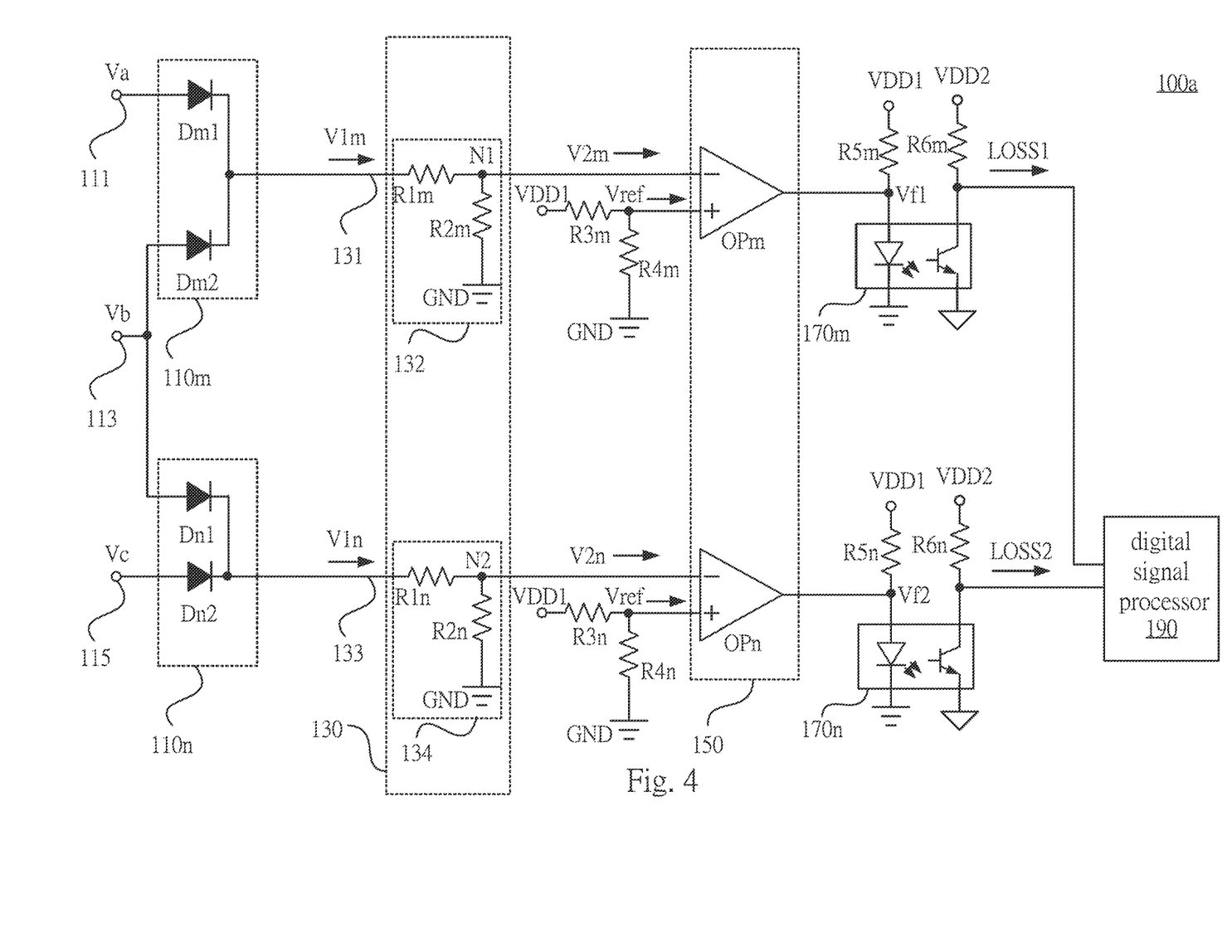
FIG. 4 is a schematic diagram of the voltage detecting circuit depicted according to some other embodiments of the present disclosure.

Referring to FIG. 4, FIG. 4 is a schematic diagram of the voltage detecting circuit 100a depicted according to some other embodiments of the present disclosure. In FIG. 4, the similar elements related to the embodiment of FIG. 2 are denoted by the same reference numerals to facilitate understanding, and the detailed principles of the similar elements are described in detail in the previous descriptions. Those elements without cooperative operating with the elements in FIG. 4 are not mentioned herein for the sake of brevity.

Compared with the voltage detecting circuit 100 depicted in FIG. 2, the configurations of some of the elements in the embodiment shown in FIG. 4 are the same or similar, and the voltage detecting circuit 100a here may include two groups of rectifying circuits 110m, 110n, a voltage dividing circuit 130, a comparing circuit 150, two groups of isolating circuits 170m, 170n, and a digital signal processor 190.

As shown in the figures, the rectifying circuit 110m is configured to rectify and superimpose a phase voltage Va and a phase voltage Vb to output a rectified voltage V1m. Similarly, the rectifying circuit 110n is configured to rectify and superimpose the phase voltage Vb and a phase voltage Vc to output a rectified voltage V1n.

The voltage dividing circuit 130 is configured to divide the rectified voltage V1m and the rectified voltage V1n respectively to output a sampling voltage V2m and a sampling voltage V2n accordingly.

The comparing circuit 150 is configured to compare the sampling voltage V2m and the sampling voltage V2n with the reference voltage Vref respectively to provide a phase failure detecting voltage Vf1 and a phase failure detecting voltage Vf2, respectively, wherein the waveforms of the phase failure detecting voltage Vf1 and the phase failure detecting voltage Vf2 vary in response to whether the power is supplied via the AC phase voltages Va, Vb, Vc.

Specifically, the rectifying circuit 110m includes diode units Dm1, Dm2. The anode ends of the diode units Dm1, Dm2 are electrically coupled to the corresponding phase voltage Va and the phase voltage Vb respectively, and the cathode ends of the diode units Dm1, Dm2 are electrically coupled with each other. Therefore, the diode units Dm1, Dm2 may be configured to half-wave rectify the corresponding phase voltage Va and the phase voltage Vb respectively, and output the superimposed rectified voltage V1m to a voltage dividing unit 132 in the voltage dividing circuit 130.

The voltage dividing unit 132 includes a resistor R1m and a resistor R2m coupled with each other in series. Structurally, a first end of the resistor R1m is electrically coupled to cathode ends of the diode units Dm1, Dm2. A first end of the resistor R2m is electrically coupled to a second end of the resistor R1m, and a second end of the resistor R2m is electrically coupled to a ground end GND. Therefore, the voltage dividing unit 132 may divide and sample the rectified voltage V1m and output the sampling voltage V2m.

Similarly, the rectifying circuit 110n includes diode units Dn1, Dn2. The anode ends of the diode units Dn1, Dn2 are electrically coupled to the corresponding phase voltage Vb and the phase voltage Vc respectively, and the cathode ends of the diode units Dn1, Dn2 are electrically coupled with each other. Therefore, the diode units Dn1, Dn2 may be configured to half-wave rectify the corresponding phase voltage Vb and the phase voltage Vc respectively, and output the superimposed rectified voltage V1n to a voltage dividing unit 134 in the voltage dividing circuit 130.

Similarly, the voltage dividing unit 134 includes a resistor R1n and a resistor R2n coupled with each other in series. Structurally, a first end of the resistor R1n is electrically coupled to cathode ends of the diode units Dn1, Dn2. A first end of the resistor R2n is electrically coupled to a second end of the resistor R1n, and a second end of the resistor R2n is electrically coupled to the ground end GND. Therefore, the voltage dividing unit 134 may divide and sample the rectified voltage V1n and output the sampling voltage V2n.

In the present embodiments, the comparing circuit 150 includes comparison amplifiers OPm, OPn. First inputs of the comparison amplifiers OPm, OPn are electrically coupled to the second end of the corresponding resistor R1m of the voltage dividing unit 132 and the second end of the resistor R1n of the voltage dividing unit 134 respectively, to receive the sampling voltages V2m, V2n respectively. Second inputs of the comparison amplifiers OPm, OPn are configured to receive the reference voltage Vref. Outputs of the comparison amplifiers OPm, OPn are configured to provide and output corresponding phase failure detecting voltages Vf1, Vf2 respectively. Similar to the previous embodiments, the reference voltage Vref may be a DC signal with a fixed level or a half-wave rectified signal.

The isolating circuit 170m is electrically coupled between the comparing circuit 150 and the digital signal processor 190. Specifically, the first side of the isolating circuit 170m is electrically coupled to the output of the comparison amplifier OPm to receive the phase failure detecting voltage Vf1, and is coupled to a supply voltage VDD1 (e.g., about 15V) of the high-voltage side through a resistor R5m. The second side of the isolating circuit 170m is coupled to a supply voltage VDD2 (e.g., about 5V) of the low-voltage side through a resistor R6m, and is configured to output a control signal LOSS1 corresponding to the phase failure detecting voltage Vf1 to the digital signal processor 190.

Similarly, the isolating circuit 170n is electrically coupled between the comparing circuit 150 and the digital signal processor 190. Specifically, the first side of the isolating circuit 170n is electrically coupled to the output of the comparison amplifier OPn to receive the phase failure detecting voltage Vf2, and is coupled to a supply voltage VDD1 (e.g., about 15V) of the high-voltage side through a resistor R5n. The second side of the isolating circuit 170n is coupled to a supply voltage VDD2 (e.g., about 5V) of the low-voltage side through a resistor R6n, and is configured to output a control signal LOSS2 corresponding to the phase failure detecting voltage Vf2 to the digital signal processor 190.

Thus, the digital signal processor 190 electrically coupled to the second sides of the isolating circuits 170m, 170n may be configured to determine whether the phase voltages Va, Vb, Vc are supplied based on the sum of phases of the control signals LOSS1, LOSS2.

In other words, the digital signal processor 190 may determine whether the phase voltages Va, Vb, and Vc are unbalanced based on the phase failure detecting voltages Vf1, Vf2 to initiate the protection mechanism when the phase failure of one of the phase voltages Va, Vb, Vc occurs. Further, the changes of the waveforms of the phase failure detecting voltages Vf1, Vf2 are not the same due to the occurrence of phase failure of the different phase voltages Va, Vb, Vc, and thus the individual supply status of each phase of the phase voltages Va, Vb, Vc may be further determined based on the phase failure detecting voltages Vf1, Vf2 accurately.

Reference is made to FIG. 5A-5D. FIGS. 5A-5D are signal waveform diagrams of the voltage detecting circuit 100a in different input voltage conditions depicted according to some embodiments of the present disclosure.

Figure 5A:
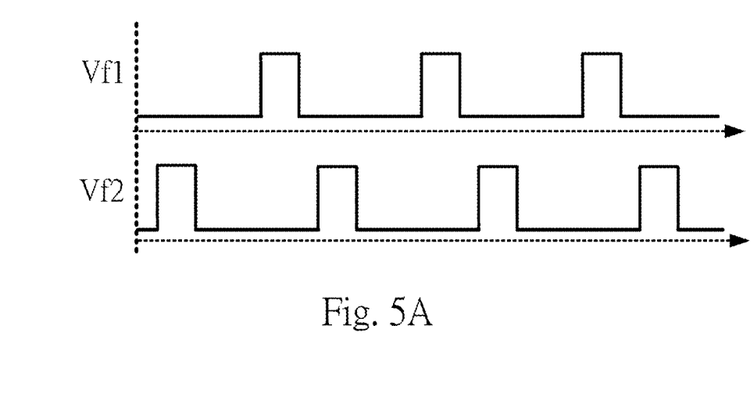
FIGS. 5A-5D are signal waveform diagrams of the voltage detecting circuit in different input voltage conditions depicted according to some embodiments of the present disclosure.

As shown in FIG. 5A, when the AC phase voltages Va, Vb, Vc are operated in balance, the amplitudes of phase voltages are the same, and the phase difference is 120 degrees, during the period that the rectified AC phase voltages Va, Vb are at a low level, the sampling voltage V2m is less than the reference voltage Vref, so that the comparison amplifier OPm outputs the phase failure detecting voltage Vf1 with a high level accordingly. During the remaining period, the sampling voltage V2m is greater than the reference voltage Vref, so that the comparison amplifier OPm outputs the phase failure detecting voltage Vf1 with a low level accordingly.

Similarly, during the period that the rectified AC phase voltages Vb, Vc are at a low level, the sampling voltage V2n is less than the reference voltage Vref, so that the comparison amplifier OPn outputs the phase failure detecting voltage Vf2 with a high level accordingly. During the remaining period, the sampling voltage V2n is greater than the reference voltage Vref, so that the comparison amplifier OPm outputs the phase failure detecting voltage Vf2 with a low level accordingly.

Figure 5B:
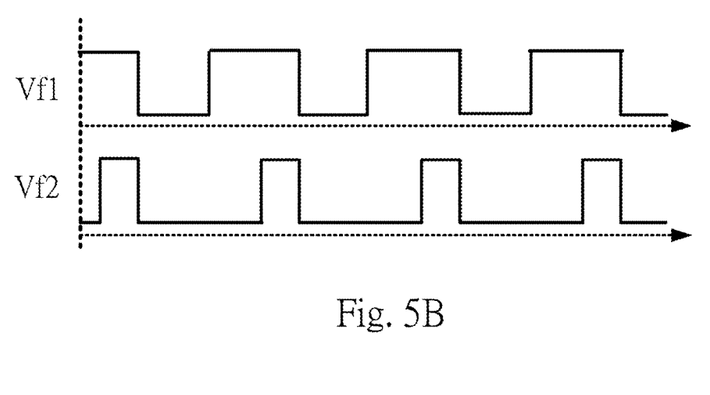

As shown in FIG. 5B, when the phase failure of the AC phase voltage Va occurs, the waveform of the phase failure detecting voltage Vf2 is not affected. However, during the period that the rectified AC phase voltage Vb is at a low level, the sampling voltage V2m is less than the reference voltage Vref, so that the comparison amplifier OPm outputs the phase failure detecting voltage Vf1 with a high level accordingly. Therefore, the duty cycle of the phase failure detecting voltage Vf1 increases.

Figure 5C:
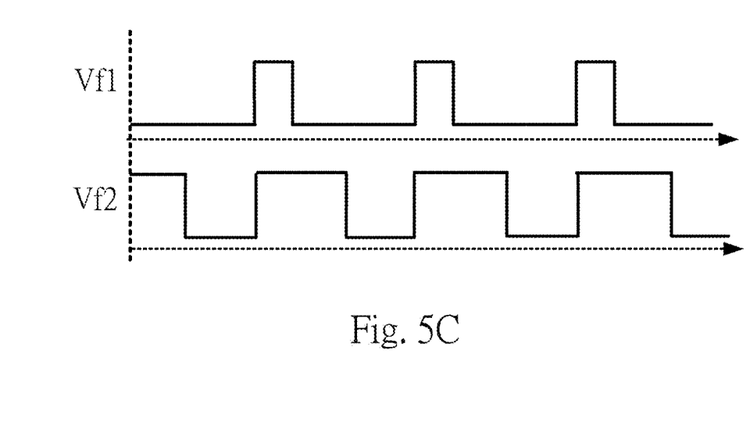
Figure 5D:
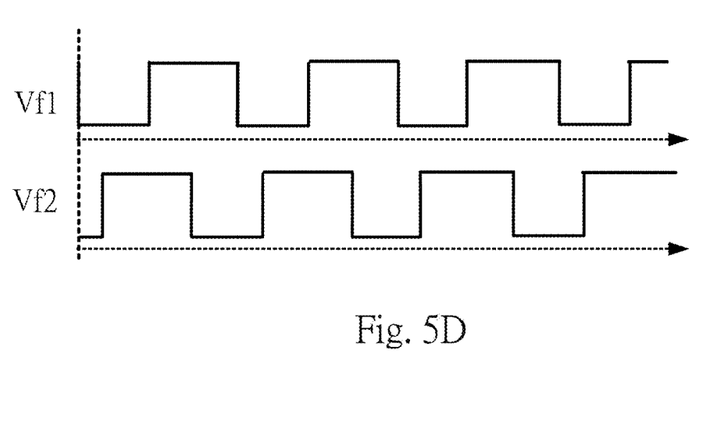

Similarly, as shown in FIG. 5C, when the phase failure of the AC phase voltage Vc occurs, the waveform of the phase failure detecting voltage Vf1 is not affected, and the duty cycle of the phase failure detecting voltage Vf2 increases. As shown in FIG. 5D, when the phase failure of the AC phase voltage Vb occurs, both of the duty cycles of the phase failure detecting voltage Vf1 and the phase failure detecting voltage Vf2 increase.

Since the control signals LOSS1, LOSS2 are opposite to the waveforms of the phase failure detecting voltage Vf1 and the phase failure detecting voltage Vf2 respectively, the control signals LOSS1, LOSS2 both have higher duty cycles during power supplying within the three-phase balanced. When the phase failure of the AC phase voltage Va occurs, the duty cycle of the control signal LOSS1 decreases. When the phase failure of the AC phase voltage Vc occurs, the duty cycle of the control signal LOSS2 decreases. When the phase failure of the AC phase voltage Vb occurs, the duty cycles of the control signals LOSS1, LOSS2 both decrease.

Thus, the digital signal processor 190 may determine whether one of the AC phase voltages Va, Vb, Vc is normally supplied individually based on the waveforms of the control signals LOSS1, LOSS2 by detecting the changes of the voltage levels of the control signals LOSS1, LOSS2.

Figure 6:
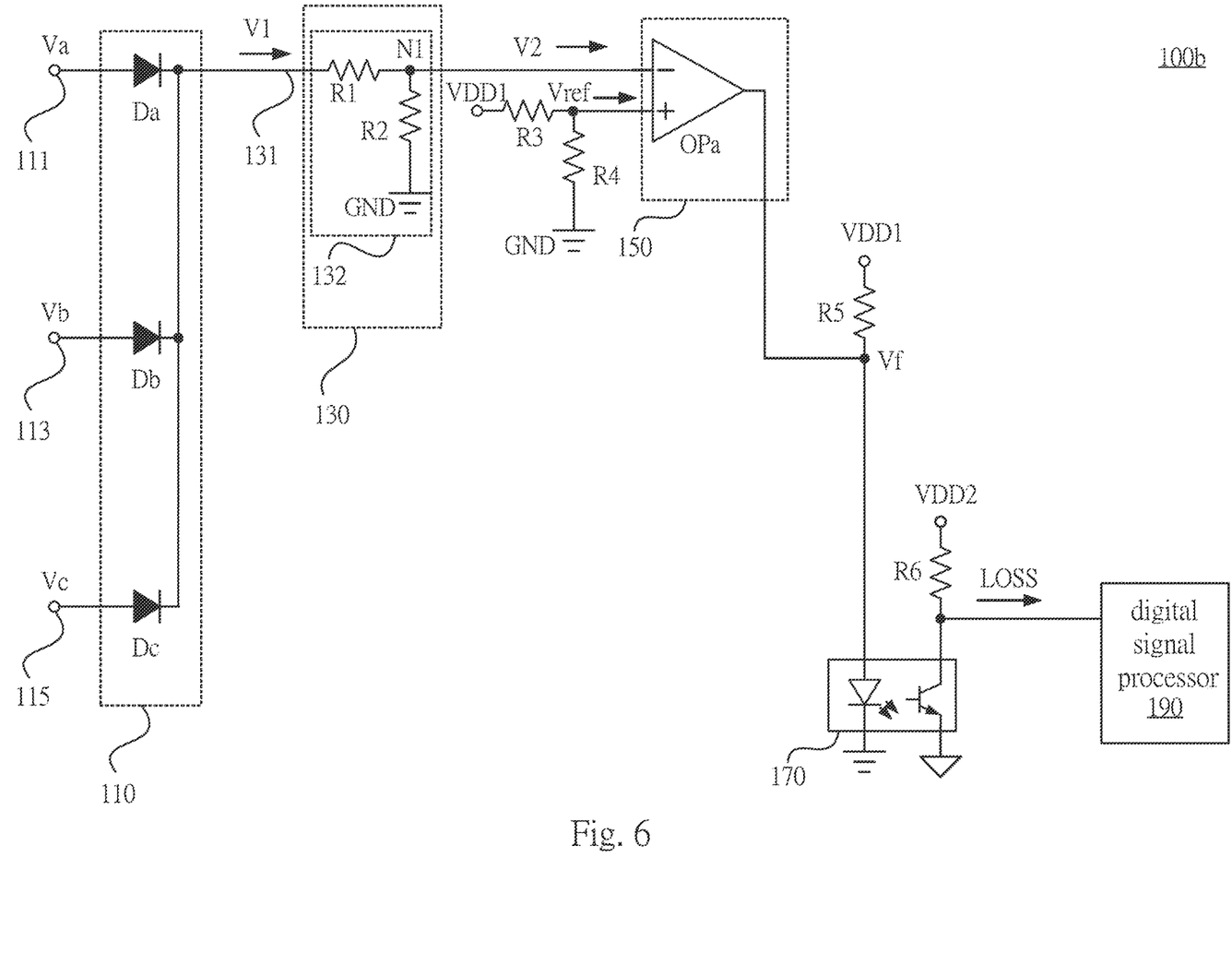
FIG. 6 is a schematic diagram of the voltage detecting circuit depicted according to some other embodiments of the present disclosure.

Reference is made to FIG. 6. FIG. 6 is a schematic diagram of the voltage detecting circuit 100b depicted according to some other embodiments of the present disclosure. In FIG. 6, the similar elements related to the embodiments of FIGS. 2 and 4 are denoted by the same reference numerals to facilitate understanding, and the detailed principles of the similar elements are described in detail in the previous descriptions. Those elements without cooperative operating with the elements in FIGS. 2 and 4 are not mentioned herein for the sake of brevity.

Compared with the voltage detecting circuits 100, 100a depicted in FIGS. 2 and 4, the configurations of some of the elements in the embodiment shown in FIG. 6 are the same or similar, and the anode ends of the diode elements Da, Db, Dc of the rectifying circuit 110 of the voltage detecting circuit 100b may receive the corresponding AC phase voltages Va, Vb, Vc respectively, to half-wave rectify the corresponding AC phase voltages Va, Vb, Vc. The cathode ends of the diode units Da, Db, Dc are electrically coupled with each other, to superimpose the half-wave rectified voltage signals and output the rectified voltage V1.

The voltage dividing circuit 130 includes a group of voltage dividing units 132. The voltage dividing unit 132 includes a resistor R1 and a resistor R2 coupled with each other in series. Structurally, a first end of the resistor R1 is electrically coupled to the cathode ends of the diode units Da, Db, Dc. A first end of the resistor R2 is electrically coupled to a second end of the resistor R1, and a second end of the resistor R2 is electrically coupled to the ground end GND. Therefore, the voltage dividing unit 132 may divide and sample the rectified voltage V1 and output the sampling voltage V2.

Therefore, the comparing circuit 150 may compare the sampling voltage V2 with the reference voltage Vref, and determine whether the three phase voltages is balance by the isolating circuit 170 and the digital signal processor 190. The specific operations are similar to the previous embodiment, and thus omitted herein for the sake of brevity.

The various elements in the above embodiments may be implemented by various types of digital or analog circuits, or may be implemented by different integrated circuit chips. Various elements may also be integrated into a single control chip. Various control circuits may also be implemented by various processors or other integrated circuit chips. The above is only for illustration, and the present disclosure is not limited thereto.

Based on the above, in the various embodiments of the present disclosure, the voltage detecting circuit may obtain one or more phase failure detecting voltages based on the plurality of detected phase voltages, determine whether the AC phase voltage is in the normal power supply condition based on the voltage level, the waveform variations, and/or phase differences of phase failure detecting voltages, and initiates a protection mechanism when the phase failure of one of any phases of the AC phase voltage occurs or the degree of the unbalanced of the three phases exceeds the upper threshold value, so that the inverter or other electronic apparatuses for receiving three-phase power may break off to avoid unbalanced power supply from damaging the internal components of the electronic apparatuses.

Although the disclosure has been described in considerable detail with reference to certain embodiments thereof, it will be understood that the embodiments are not intended to limit the disclosure. It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A voltage detecting circuit, comprising:
   a rectifying circuit configured to rectify a plurality of AC phase voltages to output a plurality of rectified voltages respectively;
   a voltage dividing circuit configured to divide the plurality of rectified voltages respectively to output a plurality of divided voltages;
   a plurality of comparing circuits configured to compare the plurality of divided voltages with a reference voltage respectively to provide a phase failure detecting voltage;
   a digital signal processor configured to determine whether the AC phase voltages are unbalanced based on a voltage level of the phase failure detecting voltage, and
   an isolating circuit electrically coupled between the comparing circuit and the digital signal processor, wherein a first end of the isolating circuit is configured to receive the phase failure detecting voltage, and a second end of the isolating circuit is configured to provide a control signal corresponding to the phase failure detecting voltage to the digital signal processor, wherein the digital signal processor is further configured to determine whether the AC phase voltages are unbalanced based on the control signal,
   wherein on the condition that the AC phase voltages are unbalanced, the phase failure detecting voltage is switched between a high level and a low level.

2. The voltage detecting circuit of claim 1, wherein the comparing circuit comprises a plurality of comparison amplifiers, any one of the comparison amplifiers comprising:
   a first input electrically coupled to the voltage dividing circuit and configured to receive a corresponding one of the divided voltages;
   a second input configured to receive the reference voltage; and
   an output configured to provide the phase failure detecting voltage,
   wherein the outputs of the comparison amplifiers are electrically coupled with each other.

3. The voltage detecting circuit of claim 1, wherein the voltage dividing circuit comprises a plurality of voltage dividing units, wherein any one of the voltage dividing units comprises a first resistor and a second resistor coupled with each other in series.

4. The voltage detecting circuit of claim 1, wherein the reference voltage is a DC signal with a fixed level or a half-wave rectified signal.

5. The voltage detecting circuit of claim 1, wherein the rectifying circuit comprises:
   a first diode unit configured to half-wave rectify a first phase voltage of the AC phase voltages to output a corresponding first rectified voltage of the rectified voltages;
   a second diode unit configured to half-wave rectify a second phase voltage of the AC phase voltages to output a corresponding second rectified voltage of the rectified voltages; and
   a third diode unit configured to half-wave rectify a third phase voltage of the AC phase voltages to output a corresponding third rectified voltage of the rectified voltages.

6. The voltage detecting circuit of claim 5, wherein the voltage dividing circuit comprises:
   a first resistor, wherein a first end of the first resistor is electrically coupled to a cathode end of the first diode unit;
   a second resistor, wherein a first end of the second resistor is electrically coupled to a second end of the first resistor, and a second end of the second resistor is electrically coupled to a ground end;
   a third resistor, wherein a first end of the third resistor is electrically coupled to a cathode end of the second diode unit;
   a fourth resistor, where in a first end of the fourth resistor is electrically coupled to a second end of the third resistor, and a second end of the fourth resistor is electrically coupled to the ground end;
   a fifth resistor, wherein a first end of the fifth resistor is electrically coupled to a cathode end of the third diode unit; and
   a sixth resistor, wherein a first end of the sixth resistor is electrically coupled to a second end of the fifth resistor, and a second end of the sixth resistor is electrically coupled to the ground end.

7. The voltage detecting circuit of claim 6, wherein the comparing circuit comprises:
   a first comparison amplifier, wherein a first input of the first comparison amplifier is electrically coupled to the second end of the first resistor to receive a first divided voltage of the divided voltages, and a second input of the first comparison amplifier is configured to receive the reference voltage;
   a second comparison amplifier, wherein a first input of the second comparison amplifier is electrically coupled to the second end of the third resistor to receive a second divided voltage of the divided voltages, and a second input of the second comparison amplifier is configured to receive the reference voltage; and
   a third comparison amplifier, wherein a first input of the third comparison amplifier is electrically coupled to the second end of the fifth resistor to receive a third divided voltage of the divided voltages, and a second input of the third comparison amplifier is configured to receive the reference voltage,
   wherein the outputs of the first comparison amplifier, the second comparison amplifier, and the third comparison amplifier are coupled with each other to output the phase failure detecting voltage.

8. The voltage detecting circuit of claim 7, further comprising:
   an isolating circuit, wherein a first end of the isolating circuit is electrically coupled to the outputs of the first comparison amplifier, the second comparison amplifier, and the third comparison amplifier to receive the phase failure detecting voltage, and a second end of the isolating circuit is configured to provide a control signal corresponding to the phase failure detecting voltage; and
   a digital signal processor electrically coupled to the second end of the isolating circuit and configured to determine whether the AC phase voltages are unbalanced based on the control signal.

9. A voltage detecting circuit, coupled to a three-phase AC power configured to provide a first phase voltage, a second phase voltage and a third phase voltage, wherein the voltage detecting circuit comprises:
   a first rectifying circuit configured to rectify and superimpose the first phase voltage and the second phase voltage to output a first rectified voltage;

a second rectifying circuit configured to rectify and superimpose the second phase voltage and the third phase voltage to output a second rectified voltage;

a voltage dividing circuit, comprising a first voltage dividing unit and a second voltage dividing unit, wherein the first voltage dividing unit is configured to divide the first rectified voltage to output a first divided voltage accordingly, and wherein the second voltage dividing unit is configured to divide the second rectified voltage to output a second divided voltage accordingly; and a comparing circuit configured to compare the first divided voltage and the second divided voltage with a reference voltage respectively to provide a first phase failure detecting voltage and a second phase failure detecting voltage accordingly, wherein waveforms of the first phase failure detecting voltage and the second phase failure detecting voltage vary in response to whether a power is supplied via the first phase voltage, the second phase voltage, or the third phase voltage.

10. The voltage detecting circuit of claim 9, wherein the comparing circuit comprises:
a first comparison amplifier, comprising:
a first input electrically coupled to the voltage dividing circuit and configured to receive the first divided voltage;
a second input configured to receive the reference voltage; and
an output configured to provide the first phase failure detecting voltage; and
a second comparison amplifier, comprising:
a first input electrically coupled to the voltage dividing circuit and configured to receive the second divided voltage;
a second input configured to receive the reference voltage; and
an output configured to provide the second phase failure detecting voltage.

11. The voltage detecting circuit of claim 9, further comprising:
a digital signal processor configured to determine whether the first phase voltage, the second phase voltage, and the third phase voltage are unbalanced based on the first phase failure detecting voltage and the second phase failure detecting voltage.

12. The voltage detecting circuit of claim 11, further comprising:
a first isolating circuit electrically coupled between the comparing circuit and the digital signal processor, wherein a first end of the first isolating circuit is configured to receive the first phase failure detecting voltage, and a second end of the first isolating circuit is configured to provide a first control signal corresponding to the first phase failure detecting voltage to the digital signal processor; and
a second isolating circuit electrically coupled between the comparing circuit and the digital signal processor, wherein a first end of the second isolating circuit is configured to receive the second phase failure detecting voltage, and a second end of the second isolating circuit is configured to provide a second control signal corresponding to the second phase failure detecting voltage to the digital signal processor,
wherein the digital signal processor is further configured to determine whether power is supplied via the first phase voltage, the second phase voltage, or the third phase voltage based on the phases of the first control signal and the second control signal.

13. The voltage detecting circuit of claim 9, wherein the voltage dividing circuit comprises:
a first voltage dividing unit comprising a first resistor and a second resistor coupled with each other in series; and
a second voltage dividing unit comprising a third resistor and a fourth resistor coupled with each other in series.

14. The voltage detecting circuit of claim 9, wherein the reference voltage is a DC signal with a fixed level or a half-wave rectified signal.

15. The voltage detecting circuit of claim 9, wherein the first rectifying circuit comprises:
a first diode unit configured to half-wave rectify the first phase voltage; and
a second diode unit configured to half-wave rectify the second phase voltage, wherein a cathode end of the first diode unit and a cathode end of the second diode unit are electrically coupled with each other; and
wherein the second rectifying circuit comprises:
a third diode unit configured to half-wave rectify the second phase voltage, wherein an anode end of the second diode unit and an anode end of the third diode unit are electrically coupled with each other; and
a fourth diode unit configured to half-wave rectify the third phase voltage, wherein a cathode end of the third diode unit and a cathode end of the fourth diode unit are electrically coupled with each other.

16. The voltage detecting circuit of claim 15, wherein the voltage dividing circuit comprises:
a first resistor, wherein a first end of the first resistor is electrically coupled to the cathode end of the first diode unit;
a second resistor, wherein a first end of the second resistor is electrically coupled to a second end of the first resistor, and a second end of the second resistor is electrically coupled to a ground end;
a third resistor, wherein a first end of the third resistor is electrically coupled to the cathode end of the third diode unit; and
a fourth resistor, wherein a first end of the fourth resistor is electrically coupled to a second end of the third resistor, and a second end of the fourth resistor is electrically coupled to the ground end.

17. The voltage detecting circuit of claim 16, wherein the comparing circuit comprises:
a first comparison amplifier, wherein a first input of the first comparison amplifier is electrically coupled to the second end of the first resistor, a second input of the first comparison amplifier is configured to receive the reference voltage, and an output of the first comparison amplifier is configured to output the first phase failure detecting voltage; and
a second comparison amplifier, wherein a first input of the second comparison amplifier is electrically coupled to the second end of the third resistor, a second input of the second comparison amplifier is configured to receive the reference voltage, and an output of the second comparison amplifier is configured to output the second phase failure detecting voltage.

18. The voltage detecting circuit of claim 17, further comprising:
a first isolating circuit, wherein a first end of the first isolating circuit is electrically coupled to the output of the first comparison amplifier to receive the first phase failure detecting voltage, and a second end of the first isolating circuit is configured to provide a first control signal corresponding to the first phase failure detecting voltage;

a second isolating circuit, wherein a first end of the second isolating circuit is electrically coupled to the output of the second comparison amplifier to receive the second phase failure detecting voltage, and a second end of the second isolating circuit is configured to provide a second control signal corresponding to the second phase failure detecting voltage; and a digital signal processor electrically coupled to the second end of the first isolating circuit and the second end of the second isolating circuit respectively, and configured to determine whether power is supplied via the first phase voltage, the second phase voltage, or the third phase voltage based on the phases of the first control signal and the second control signal accordingly.

* * * * *